(12) United States Patent
Ma et al.

(10) Patent No.: US 6,744,322 B1
(45) Date of Patent: Jun. 1, 2004

(54) HIGH PERFORMANCE BIFET LOW NOISE AMPLIFIER

(75) Inventors: Pingxi Ma, Irvine, CA (US); Marco Racanelli, Santa Ana, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/057,098

(22) Filed: Jan. 23, 2002

(51) Int. Cl.[7] ................................................. H03F 3/16
(52) U.S. Cl. ........................................ 330/300; 330/311
(58) Field of Search ................................. 330/283, 300, 330/302, 311

(56) References Cited

U.S. PATENT DOCUMENTS 4,528,520 A * 7/1985 Osawa ........................ 330/300
4,754,233 A * 6/1988 Pickett ........................ 330/311
6,204,728 B1 * 3/2001 Hageraats ................... 330/311

* cited by examiner

Primary Examiner—Robert Pascal
Assistant Examiner—Khanh Van Nguyen
(74) Attorney, Agent, or Firm—Farjami & Farjami LLP

(57) ABSTRACT

According to one exemplary embodiment, a circuit comprises a bipolar transistor having a base, an emitter, and a collector. For example, the bipolar transistor can be an NPN SiGe HBT. The base of the bipolar transistor is an input of the circuit. The emitter of the bipolar transistor is coupled to a first reference voltage. According to this exemplary embodiment, the circuit further comprises a field effect transistor having a gate, a source, and a drain. For example, the field effect transistor may be an NFET. The collector of the bipolar transistor is coupled to the source of the field effect transistor. The gate of the field effect transistor is coupled to a bias voltage. The drain of the field effect transistor is coupled to a second reference voltage. The drain of the field effect transistor is an output of the circuit.

22 Claims, 4 Drawing Sheets

Fig. 4

| LNA Configuration | Bias Current | Power Gain | Noise Figure (NF) | Linearity (IIP3) |
|---|---|---|---|---|
| Single Stage LNA | ~ 3.0 mA | ~ 14.0 dB | ~ 1.3 dB | ~ -4.0 dBm |
| Bipolar Cascode LNA | ~ 3.0 mA | > 14.0 dB | > 1.3 dB | < -4.0 dBm |
| Bipolar Cascade LNA | ~ 6.0 mA | * | * | * |
| BiFET LNA | ~ 3.0 mA | ~ 19.0 dB | 1.2 dB | 7.3 dBm | ns
HIGH PERFORMANCE BIFET LOW NOISE AMPLIFIER

BACKGROUND OF THE INVENTION

1. Field of the Invention

The present invention is generally in the field of semiconductor circuits. More particularly, the present invention is in the field of low noise amplifiers.

2. Related Art

Consumers continue to demand increased performance and lower cost from wireless communication devices, such as cell phones and Bluetooth-enabled transceivers. To meet this demand, manufacturers are faced with the challenge of increasing the performance of the various circuits in the wireless communication devices, while reducing the cost of those circuits. For example, wireless communication device manufacturers are challenged to provide low noise amplifiers (LNA) to meet high performance criteria, such as high gain, low noise, and high linearity, in the receivers of wireless communication devices at reduced cost.

In an attempt to meet the above LNA high performance criteria, manufacturers have provided an LNA having one transistor in a single stage circuit configuration. Although silicon-germanium (SiGe), gallium-arsenide (GaAs), and indium-phosphite (InP) technologies have been utilized to fabricate a heterojunction bipolar transistor (HBT) and/or a Field Effect Transistor (FET) for the single stage LNA, GaAs and InP HBTs have been more successful in meeting high performance criteria. However, HBTs/FETs utilizing GaAs or InP technologies are more expensive to fabricate than HBTs utilizing SiGe BiCMOS technology.

In another attempt to meet the above desired LNA performance criteria, manufacturers have provided an LNA utilizing a dual stage, two transistor circuit configuration. However, conventional dual stage, two transistor LNAs typically suffer from various performance limitations. For example, an LNA utilizing two SiGe HBTs in a cascode configuration exhibits undesirable high noise and/or poor linearity. By way of another example, an LNA utilizing a FET in both the input and output stages of a conventional dual stage cascode configuration exhibits undesirable high noise and low gain.

In a further attempt to meet the above LNA performance criteria, manufacturers have provided a dual stage LNA having two transistors, such as two SiGe HBTs, coupled in a cascode configuration. For example, in a cascode configuration, the collector of the first SiGe HBT can be coupled to the base of the second SiGe HBT, and the emitters of both SiGe HBTs can be connected to ground. As a result of having to provide bias current to each SiGe HBT, the dual stage LNA utilizing two transistors in a cascode configuration suffers from a high bias current requirement. Additionally, dual stage cascode LNA configuration suffers from high noise and/or poor linearity.

FIG. 1A shows a schematic diagram of an exemplary conventional single stage LNA. Single stage LNA 100 comprises transistor 102, which can be, for example, a SiGe, GaAs, or InP HBT. The base of transistor 102 may be coupled to a radio frequency (RF) signal in a wireless communication device. The RF signal can be amplified by transistor 102 and outputted at the collector of transistor 102. The collector of transistor 102 is also coupled to a bias load, and the emitter of transistor 102 is connected to ground.

A single stage LNA, such as single stage LNA 100, exhibits undesirable low gain and poor linearity performance characteristics under low bias current when utilizing a SiGe HBT. As discussed above, although a single stage LNA might provide better performance criteria when utilizing GaAs or InP technology, GaAs or InP technology is much more expensive than SiGe BiCMOS technology.

FIG. 1B shows a schematic diagram of an exemplary conventional bipolar cascode LNA. Bipolar cascode LNA 150 includes bipolar transistor 152 and bipolar transistor 154 coupled together in a cascode configuration. Bipolar transistors 152 and 154 can be, for example, SiGe HBTs. The base of bipolar transistor 152 may be coupled to an RF signal in a wireless communication device. The emitter of bipolar transistor 152 is connected to ground, and the collector of bipolar transistor 152 is coupled to the emitter of bipolar transistor 154.

The RF signal that is inputted at the base of bipolar transistor 152 is amplified by bipolar transistors 152 and 154 and outputted at the collector of bipolar transistor 154. The collector of bipolar transistor 154 is also coupled to a bias load. As discussed above, a conventional LNA comprising two bipolar transistors in a cascode configuration, such as bipolar cascode LNA 150, suffers from low linearity.

FIG. 1C shows a schematic diagram of an exemplary conventional FET cascode LNA. FET cascode LNA 170 includes FET 172 and FET 174 coupled together in a cascode configuration. For example, both FET 172 and FET 174 can be NFETs. The gate of FET 172 may be coupled to an RF signal in a wireless communication device. The source of FET 172 is connected to ground, and the drain of FET 172 is coupled to the source of FET 174. The RF signal is inputted at the gate of FET 172 is amplified by FET 172 and FET 174 and outputted at the drain of FET 174. The drain of FET 174 is also coupled to a bias load. As discussed above, a conventional LNA comprising two FETs in a cascode configuration, such as FET cascode LNA 170, suffers from high noise and low gain.

Thus, there is a need in the art for a low-cost LNA having high gain, high linearity, and low noise at low bias current.

SUMMARY OF THE INVENTION

The present invention is directed to a high performance BiFET low noise amplifier. The invention overcomes the need in the art for a low-cost low noise amplifier having high gain, high linearity, and low noise at low bias current.

According to one exemplary embodiment, a circuit comprises a bipolar transistor having a base, an emitter, and a collector. For example, the bipolar transistor can be an NPN SiGe HBT. The base of the bipolar transistor is also an input of the circuit. A received RF signal, for example, may be coupled to the input of the circuit via a capacitor. The emitter of the bipolar transistor is coupled to a first reference voltage, which may be, for example, a ground voltage. The emitter of the bipolar transistor, for example, may be coupled to the first reference voltage through a first impedance circuit. The first impedance circuit may be an inductor, for example.

According to this exemplary embodiment, the circuit further comprises a field effect transistor having a gate, a source, and a drain. For example, the field effect transistor may be an NFET. The collector of the bipolar transistor is coupled to the source of the field effect transistor. For example, the bipolar transistor may be coupled to the field effect transistor in a cascode configuration in a BiFET low noise amplifier. The gate of the field effect transistor is coupled to a bias voltage.

The drain of the field effect transistor is coupled to a second reference voltage, which may be, for example, the power supply voltage, which is also referred to as Vdd or Vcc in circuit design terminology. The drain of the field effect transistor is also an output of the circuit. The drain of the field effect transistor may be coupled to the second reference voltage through a second impedance circuit. The second impedance circuit may comprise an inductor and a capacitor. The inductor, for example, may couple the drain of the field effect transistor to the second reference voltage. The capacitor, for example, may couple the drain of the field effect transistor to an output load.

BRIEF DESCRIPTION OF THE DRAWINGS

FIG. 4 illustrates a table comparing specifications of conventional exemplary single stage, bipolar cascode, and bipolar cascade low noise amplifiers to specifications of an exemplary BiFET low noise amplifier in accordance with one embodiment of the present invention.

DETAILED DESCRIPTION OF THE INVENTION

The present invention is directed to a high performance BiFET low noise amplifier. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 2:
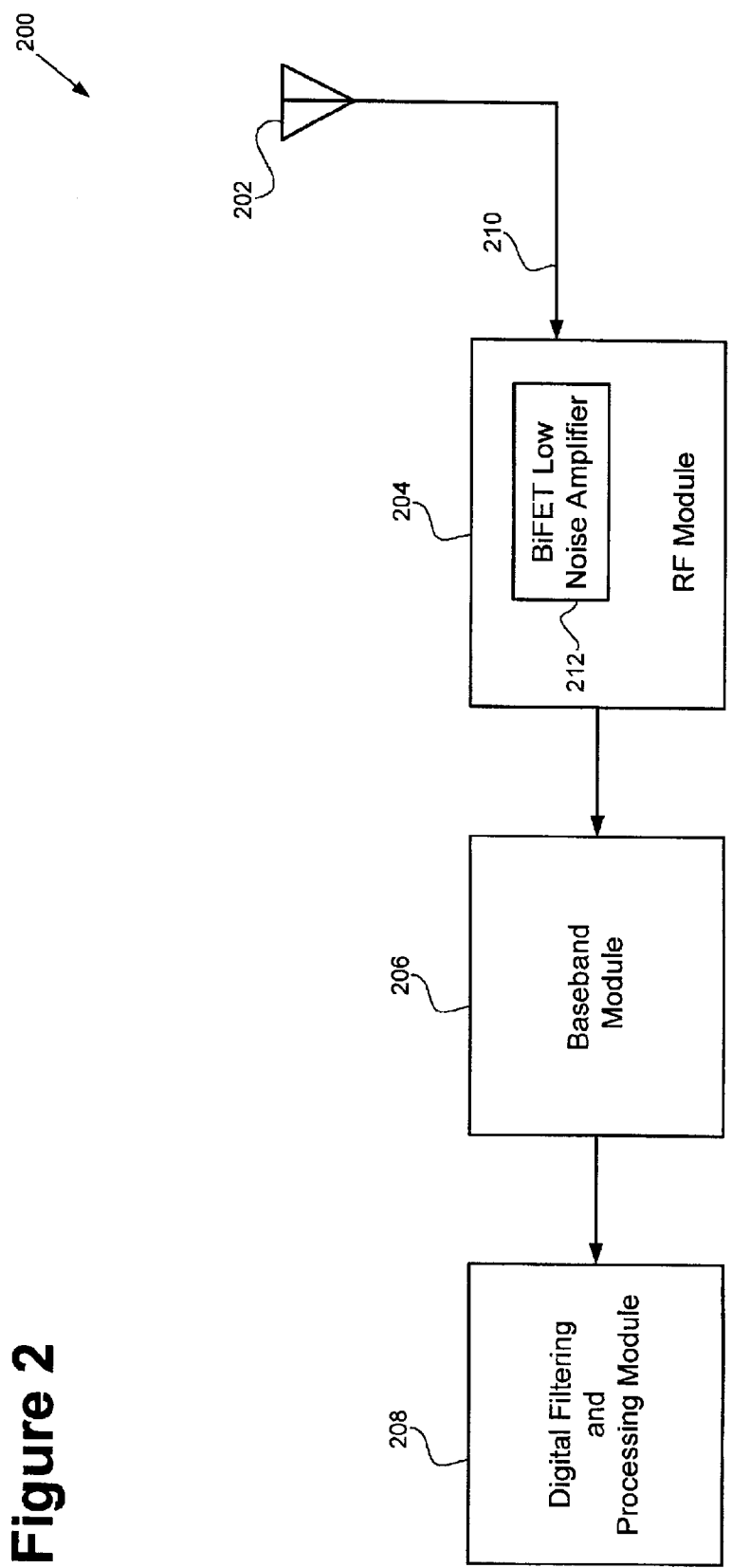
FIG. 2 is a block diagram of an exemplary receiver in which an embodiment of the present invention's BiFET low noise amplifier can be utilized.

The present invention's Bipolar-FET ("BiFET") Low Noise Amplifier ("LNA") might be used in a number of different environments and applications, for example, it might be used in a wireless communication device. In that connection, FIG. 2 shows a block diagram of an exemplary receiver in a wireless communication device in which an embodiment of the present invention's BiFET LNA might be utilized. The wireless communication device in which receiver 200 resides might be, for example, a cellular phone or a wireless modem. Receiver 200 includes antenna 202, RF module 204, baseband module 206, and digital filtering and processing module 208. Antenna 202 provides received RF signal 210 to RF module 204. In the present example, RF module 204 includes the present invention's BiFET LNA 212 for amplifying RF signal 210 received from antenna 202. The invention's BiFET LNA 212 will be described in greater detail in relation to FIG. 3.

Figure 3:
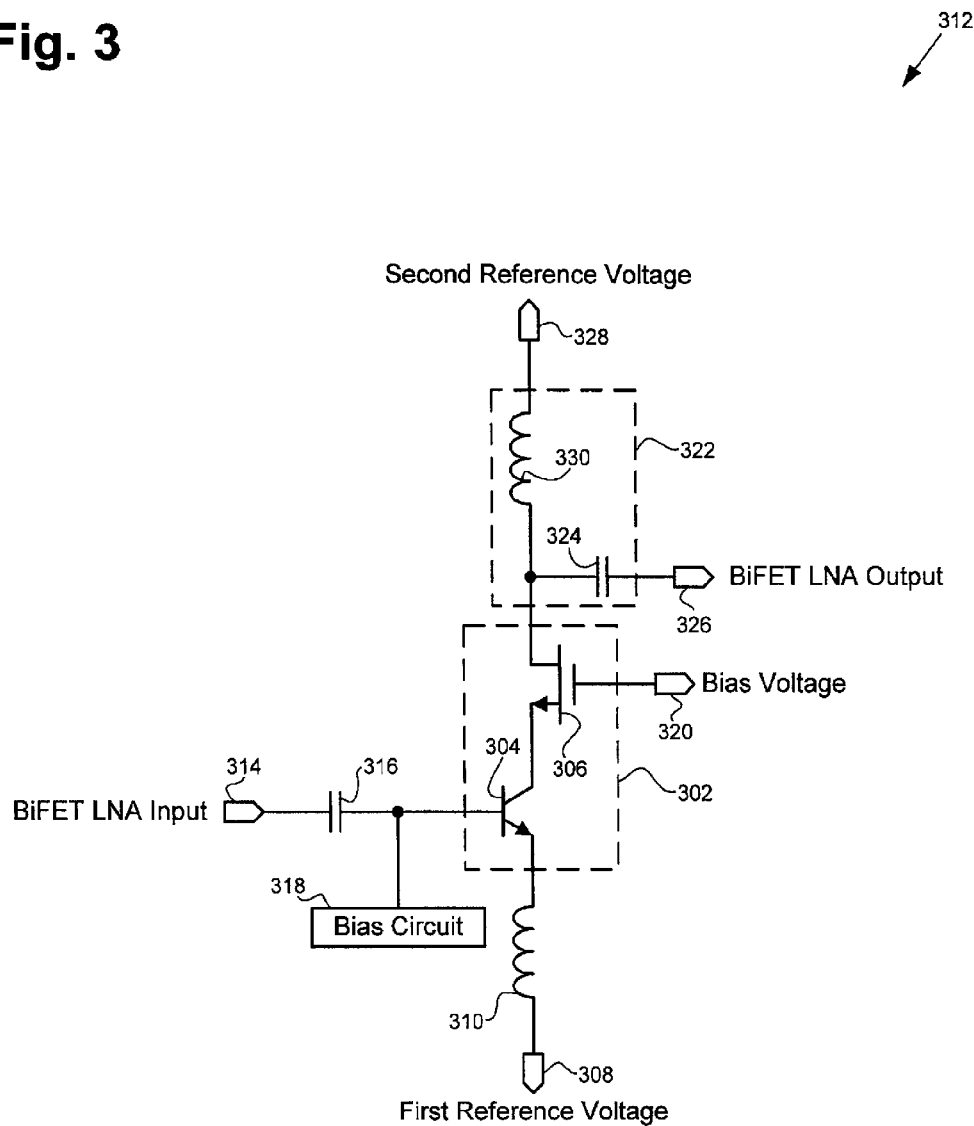
FIG. 3 illustrates a circuit diagram of an exemplary BiFET low noise amplifier in accordance with one embodiment of the present invention.

FIG. 3 shows a schematic diagram of exemplary BiFET LNA 312 in accordance with one embodiment of the present invention. By way of an example, BiFET LNA 312 might be utilized in RF module 204 as BiFET LNA 212. BiFET LNA 312 includes circuit 302, which includes bipolar transistor 304 coupled to FET 306 in a cascode configuration. In the present embodiment, bipolar transistor 304 can be an NPN SiGe HBT. In one embodiment, bipolar transistor 304 may be a PNP HBT. In another embodiment, bipolar transistor 304 may be a GaAs HBT, an InP HBT, or an HBT comprising other materials. In the present embodiment, FET 306 can be an NFET. In another embodiment, FET 306 may be a MOSFET or a MESFET.

The emitter of bipolar transistor 304 is coupled to first reference voltage 308 through an impedance circuit such as inductor 310. In the present embodiment, first reference voltage 308 can be a ground voltage. In one embodiment, first reference voltage 308 may be a reference voltage having a constant DC voltage with no AC component. BiFET LNA input 314 is coupled to the base of bipolar transistor 304, also referred to as the input of circuit 302 in the present application, through capacitor 316. In the present embodiment, BiFET LNA input 314 may be coupled to an antenna, such as antenna 202 in FIG. 2, to provide a received RF signal to BiFET LNA 312. In another embodiment, BiFET LNA input 314 may be coupled to an RF signal source other than an antenna, such as an output of a preamplifier stage in a receiver.

In BiFET LNA 312, capacitor 316 prevents DC voltage at BiFET LNA input 314 entering the input of circuit 302, i.e. the base of bipolar transistor 304. Capacitor 316 is also utilized, along with inductor 310, to provide impedance matching at the input of circuit 302. BiFET LNA 312 also includes bias circuit 318, which is coupled to the base of bipolar transistor 304. Bias circuit 318 provides DC bias for bipolar transistor 304 in a manner known in the art. The gate of FET 306 is coupled to bias voltage 320, which provides a source of DC bias voltage to the gate of FET 306. BiFET LNA 312 further includes impedance circuit 322, which is coupled to the drain of FET 306. It is noted that the drain of FET 306 is also referred to as the "output" of circuit 302 in the present application.

Impedance circuit 322 provides impedance matching between the output of circuit 302 and an output stage, not shown in FIG. 3, which can be coupled to BiFET LNA output 326. For example, BiFET LNA output 326 may be coupled to an output stage such as a mixer in an RF module of a receiver, such as RF module 204 in receiver 200 in FIG. 2. In the present embodiment, impedance circuit 322 includes capacitor 324 and inductor 330. In other embodiments, however, impedance circuit 322 may include other components in place of or in addition to capacitor 324 and/or inductor 330. In one embodiment, inductor 330 may be replaced by a capacitor or a resistor.

BiFET LNA output 326 is coupled to the output of circuit 302, i.e. the drain of FET 306, through capacitor 324. In BiFET LNA 312, second reference voltage 328 is coupled to the output of circuit 302 through inductor 330. Second reference voltage 328 provides a source of DC voltage required for the operation of circuit 302. Second reference voltage 328, for example, may be Vcc, Vdd, or other source of constant DC voltage, having no AC component.

The function and operation of BiFET LNA 312 in FIG. 3 will now be discussed. An RF signal at BiFET LNA input 314 is coupled to the input of circuit 302, i.e. the base of bipolar transistor 304, through capacitor 316. In the present embodiment, bipolar transistor 304 is configured as a common emitter amplifier as is known in the art. Thus, the RF signal inputted at the base of bipolar transistor 304 is amplified at the collector of bipolar transistor 304. The amplified RF signal at the collector of bipolar transistor 304 is directly coupled to the source of FET 306. In the present embodiment, FET 306 is configured as a common gate amplifier as is known in the art.

Thus, as the voltage of the amplified RF signal at the source of FET 306 changes, the changing voltage at the source of FET 306 causes a corresponding change in Vgs, which is the "AC" voltage between the gate and the source of FET 306. The change in Vgs causes a relatively large change in Id due to the high transconductance, which is the "AC" current flowing through the drain of FET 306, i.e. the drain current. As a result of the impedance at the drain of FET 306, the relatively large change in Id, i.e. the drain current, induces a large voltage change at the drain of FET 306. Thus, the amplified RF signal coupled to the source of FET 306 is further amplified at the drain of FET 306, i.e. the output of circuit 302, and coupled to BiFET LNA output 326 via capacitor 324. In summary, an RF signal is inputted at the input of circuit 302, i.e. the base of bipolar transistor 304. The RF signal is then amplified by bipolar transistor 304 and FET 306 in a cascode amplifier configuration, and the amplified RF signal is outputted at the output of circuit 302, i.e. the drain of FET 306.

By way of background, the performance of an LNA, such as BiFET LNA 312, can be specified using four criteria: "bias current," "noise," "linearity," and "gain." "Bias current" refers to the amount of bias current the LNA consumes. Thus, a lower bias current specification is more desirable in an LNA than a higher bias current specification. "Noise" is typically specified by a noise figure ("NF"), which indicates the amount of noise the LNA introduces into a signal that is amplified by the LNA. As is known in the art, NF=10.0*log ("S/N ratio at input"/"S/N ratio at output"), where "S/N ratio at input" refers to the signal to noise ratio at the input of the LNA, and "S/N ratio at output" refers to the signal to noise ratio at the output of the LNA. Thus, a lower NF is more desirable than a higher NF, since the lower NF indicates that the LNA introduces less noise into a signal amplified by the LNA.

"Linearity" refers to the ability of the LNA to amplify a signal without distorting the signal. The linearity of an LNA is typically determined at a particular frequency, and may be characterized as a function of input power. For example, an input third-order intermodulation intercept point ("IIP$_3$"), which can be obtained for an LNA at a particular frequency in a manner known in the art, may be used to indicate the linearity of the LNA at that frequency. A higher value of IIP$_3$ indicates that the linearity of the LNA extends to a higher input power, and thus is more desirable than a lower value of IIP$_3$. The last specification, "gain," refers to the amount of power gain the LNA can generate. The power gain of the LNA is typically indicated at a particular frequency, and may be obtained by dividing the power output of the LNA by the power input of the LNA at the specified frequency.

By utilizing bipolar transistor 304 and FET 306 in a cascode configuration in circuit 302, the present invention provides an LNA having a high linearity as indicated by a high value of IIP$_3$. For example, the value of IIP$_3$ for BiFET LNA 312 can be approximately 7.3 dBm at a frequency of 1.96 GHz. Although the linearity of BiFET LNA 312 is determined by the linearity of bipolar transistor 304 and the linearity of FET 306, the linearity of FET 306 is generally higher than the linearity of bipolar transistor 304.

In the present invention, the linearity of FET 306 is further increased by limiting the operation of FET 306 to the linear portion of its Id (drain current) vs. Vgs (gate to source voltage) curve, i.e. the linear portion of the "active region" of FET 306. For example, in the initial section of the Id vs. Vgs curve for FET 306, the operation of FET 306 is linear. In other words, in the initial section of the Id vs. Vgs curve, Id is proportional to Vgs. However, in the subsequent sections of the Id vs. Vgs curve, where Id is approximately proportional to the square of Vgs, the operation of FET 306 is not linear. Thus, limiting the operation of FET 306 close to the linear region of its Id vs. Vgs curve can improve the linearity of FET 306.

In the present invention, the linearity of HBT 304 can also be improved by increasing HBT's emitter area. However, the increase in HBT's emitter area normally degrades the HBT's RF gain. Fortunately, with the additional gain help of FET 306, the linearity of HBT 304 can be improved without degrading the power gain of BiFET LNA 312. Thus, based on the linearity improvement of both FET 306 and HBT 304, the present invention achieves a BiFET LNA having an overall high linearity.

By utilizing bipolar transistor 304 and FET 306 in a cascode configuration in circuit 302, the present invention also provides a BiFET LNA having a low NF, i.e. noise figure. For example, BiFET LNA 312 can have a value of NF equal to approximately 1.2 dB at a frequency of 1.96 GHz. Advances in SiGe BiCMOS technology have enabled the fabrication of SiGe HBTs having low noise figures. For example, a SiGe HBT may have a noise figure less than approximately 0.6 dB. Thus, in an embodiment where bipolar transistor 304 is an NPN SiGe HBT, the present invention can advantageously utilize the low NF in the NPN SiGe HBT to achieve a BiFET LNA having an overall low NF.

The present invention further provides a BiFET LNA having a low bias current by utilizing bipolar transistor 304 and FET 306 in a cascode configuration in circuit 302. For example, the bias current of BiFET LNA 312 can be approximately 2.9 mA at a frequency of 1.96 GHz. Additionally, the present invention can advantageously utilize the additional gain of FET 306 to achieve a BiFET LNA having a high gain. For example, the gain of BiFET LNA 312 can be approximately 18.9 dB at a frequency of 1.96 GHz.

Thus, by utilizing bipolar transistor 304 and FET 306 in a cascode configuration in circuit 302, the present invention achieves a BiFET LNA having high gain, high linearity, and a low noise figure at low bias current. Further, in an embodiment where bipolar transistor 304 is an NPN SiGe HBT, the present invention achieves a BiFET LNA having high gain, high linearity, and a low noise figure at low bias current by using relatively inexpensive SiGe BiCMOS technology rather than much more expensive GaAs or InP technology.

Figure 1A:
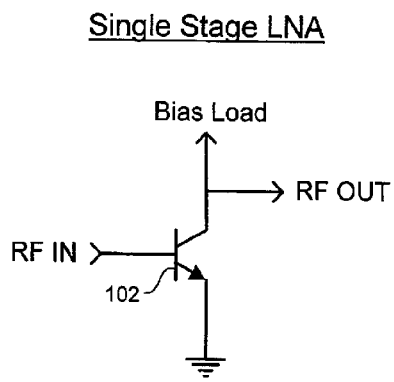
FIG. 1A illustrates a conventional exemplary single stage low noise amplifier.
Figure 1B:
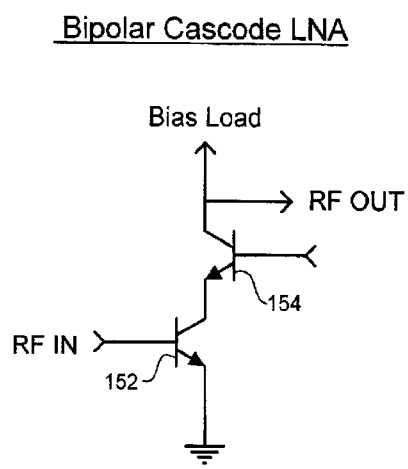
FIG. 1B illustrates a conventional exemplary bipolar cascode low noise amplifier.
Figure 1C:
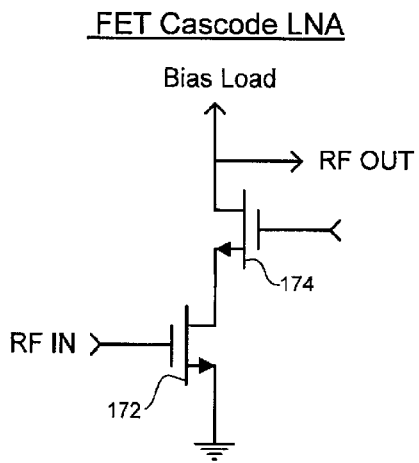
FIG. 1C illustrates a conventional exemplary FET cascode low noise amplifier.

FIG. 4 shows an exemplary table comparing specifications of conventional exemplary single stage, bipolar cascode, and bipolar cascade low noise amplifiers to specifications of an exemplary BiFET low noise amplifier in accordance with one embodiment of the present invention. It is noted that exemplary table 400 is derived at the wireless PCS band (1.96 GHz) based. Table 400 includes LNA Configuration column 402, Bias Current column 414, Power Gain column 416, Noise Figure column 418, and Linearity column 420. LNA Configuration column 402 includes single stage LNA 404, which corresponds to single stage LNA 100 in FIG. 1A, bipolar cascode LNA 406, which corresponds to bipolar cascode LNA 150 in FIG. 1B, bipolar cascade LNA 408, and BiFET LNA 412, which corresponds to BiFET LNA 212 in FIG. 2 and BiFET LNA 312 in FIG. 3. The results Bias Current column 414 shows an exemplary bias current value for the LNA configurations in LNA Configuration column 402. Power Gain column 416 shows an exemplary power gain value for the LNA configurations in LNA Configuration column 402. Noise Figure column 418 shows an exemplary noise figure value for the LNA configurations in LNA Configuration column 402, and Linearity column 420 shows an exemplary linearity value for the LNA configurations in LNA Configuration column 402.

As shown in table 400, bipolar cascade LNA 408, which includes two bipolar transistors coupled together in a cascade configuration, draws a high bias current of approximately 6.0 mA. Additionally, bipolar cascade LNA 408 typically suffers from a high noise figure and/or poor linearity. As a result of the above undesirable characteristics, bipolar cascade LNA 408 provides an unpopular LNA configuration. It is noted that power gain, noise figure, and linearity values for bipolar cascade LNA 408 are not included in table 400.

Further shown in table 400, single stage LNA 404, bipolar cascode LNA 406, and BiFET LNA 412 have similar low bias current values of approximately 3.0 mA. However, the present invention's BiFET LNA 412 has an approximate 19.0 dB power gain, which is larger than the approximate 14.0 dB power gains shown for single stage LNA 404 and bipolar cascode LNA 406. Also, the approximate 1.2 dB noise figure for BiFET LNA 412 is lower than the approximate 1.3 dB noise figure shown for single stage LNA 404 and bipolar cascode LNA 406. Additionally, the approximate 7.3 dBm linearity value for BiFET LNA 412 is much larger than the approximate −4.0 dBm linearity value shown for single stage LNA 404 and bipolar cascode LNA 406. Thus, as shown above, the invention's BiFET LNA 412 achieves a higher power gain, a lower noise figure, and a higher linearity at low bias current as compared with either conventional single stage LNA 404 or conventional bipolar cascode LNA 406.

Thus, the present invention provides a BiFET LNA that achieves high gain, high linearity, and a relatively low noise figure at low bias current. In other words, the present invention provides a BiFET LNA that achieves high performance at low bias current. Further, as discussed above, the present invention provides a BiFET LNA that achieves high performance at low bias current by using relatively inexpensive SiGe BiCMOS technology rather than much more expensive GaAs or InP technology.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a high performance BiFET low noise amplifier has been described.

What is claimed is:

1. A circuit comprising:
   a bipolar transistor having a base, an emitter, and a collector, said bipolar transistor comprising a SiGe HBT;
   a field effect transistor having a gate, a source, and a drain;
   said base of said bipolar transistor being an input of said circuit;
   said emitter of said bipolar transistor being coupled to a first reference voltage;
   said collector of said bipolar transistor being coupled to said source of said field effect transistor;
   said gate of said field effect transistor being coupled to a bias voltage;
   said drain of said field effect transistor being coupled to a second reference voltage;
   said drain of said field effect transistor being an output of said circuit;
   wherein said drain of said field effect transistor is not coupled to said base of said bipolar transistor by a feedback network, wherein said drain of said field effect transistor is directly coupled to a first capacitor, said first capacitor being directly coupled to a BiFET low noise amplifier output wherein said base of said bipolar transistor is directly coupled to a second capacitor and directly coupled to a bias circuit.

2. The circuit of claim 1 wherein said emitter of said bipolar transistor is coupled to said first reference voltage through a first impedance circuit.

3. The circuit of claim 2 wherein said first impedance circuit comprises an inductor.

4. The circuit of claim 1 wherein said drain of said field effect transistor is coupled to said second reference voltage through a second impedance circuit.

5. The circuit of claim 4 wherein said second impedance circuit comprises an inductor and said first capacitor.

6. The circuit of claim 1 wherein said bipolar transistor is an NPN SiGe HBT.

7. The circuit of claim 1 wherein said field effect transistor is an NFET.

8. The circuit of claim 1 wherein said bipolar transistor is coupled to said field effect transistor in a cascode configuration in a BiFET low noise amplifier.

9. The circuit of claim 1 wherein said first reference voltage is a ground voltage.

10. The circuit of claim 5 wherein said inductor couples said drain of said field effect transistor to said second reference voltage.

11. The circuit of claim 1 wherein a second capacitor couples a received RF signal to said input of said circuit.

12. The circuit of claim 1 wherein said second reference voltage is Vdd.

13. A BiFET low noise amplifier comprising:
   a bipolar transistor having a base, an emitter, and a collector, said bipolar transistor comprising a SiGe HBT;
   a field effect transistor having a gate, a source, and a drain;
   an input of said BiFET low noise amplifier being coupled to said base of said bipolar transistor;
   said emitter of said bipolar transistor being coupled to a first reference voltage through a first impedance circuit;
   said collector of said bipolar transistor being coupled to said source of said field effect transistor;

said gate of said field effect transistor being coupled to a bias voltage;

said drain of said field effect transistor being directly coupled to a first capacitor, said first capacitor being directly coupled to a second reference voltage through a second impedance circuit, said drain of said field effect transistor being directly coupled to an output of said BiFET low noise amplifier, and wherein said drain of said field effect transistor is not coupled to said base of said bipolar transistor by a feedback network wherein said base of said bipolar transistor is directly coupled to a second capacitor and directly coupled to a bias circuit.

14. The BiFET low noise amplifier of claim 13 wherein said bipolar transistor is an NPN SiGe HBT.

15. The BiFET low noise amplifier of claim 13 wherein said field effect transistor is an NFET.

16. The BiFET low noise amplifier of claim 13 wherein said first reference voltage is a ground voltage.

17. The BiFET low noise amplifier of claim 13 wherein said first impedance circuit comprises an inductor.

18. The BiFET low noise amplifier of claim 13 wherein said second impedance circuit comprises an inductor and said first capacitor.

19. The BiFET low noise amplifier of claim 18 wherein said inductor couples said drain of said field effect transistor to said second reference voltage.

20. The BiFET low noise amplifier of claim 13 wherein a received RF signal at said input of said BiFET low noise amplifier is coupled to said base of said bipolar transistor.

21. A circuit comprising:

a bipolar transistor having a base, an emitter, and a collector, said bipolar transistor comprising a SiGe HBT;

a field effect transistor having a gate, a source, and a drain;

said base of said bipolar transistor being an input of said circuit;

said emitter of said bipolar transistor being coupled to a first reference voltage through a first impedance circuit, said first impedance circuit comprising an inductor;

said collector of said bipolar transistor being coupled to said source of said field effect transistor;

said gate of said field effect transistor being coupled to a bias voltage;

said drain of said field effect transistor being coupled to a second reference voltage;

said drain of said field effect transistor being an output of said circuit, and wherein said drain of said field effect transistor is not coupled to said base of said bipolar transistor by a feedback network wherein said drain of said field effect transistor is directly coupled to a first capacitor, said first capacitor being directly coupled to a BiFET low noise amplifier output, wherein said base of said bipolar transistor is directly coupled to a second capacitor and directly coupled to a bias circuit.

22. A BiFET low noise amplifier comprising:

a bipolar transistor having a base, an emitter, and a collector, said bipolar transistor comprising a SiGe HBT;

a field effect transistor having a gate, a source, and a drain;

an input of said BiFET low noise amplifier being coupled to said base of said bipolar transistor;

said emitter of said bipolar transistor being coupled to a first reference voltage though a first impedance circuit, said first impedance circuit comprising an inductor;

said collector of said bipolar transistor being coupled to said source of said field effect transistor;

said gate of said field effect transistor being coupled to a bias voltage;

said drain of field effect transistor being coupled to a second reference voltage through a second impedance circuit, said drain of said field effect transistor being directly coupled to a first capacitor, said first capacitor being directly coupled to an output of said BiFET low noise amplifier, and wherein said drain of said field effect transistor is not coupled to said base of said bipolar transistor by a feedback network wherein said base of said bipolar transistor is directly coupled to a second capacitor and directly coupled to a bias circuit.

* * * * *